United States Patent [19]

Hachiyama et al.

[11] Patent Number: 5,191,425

[45] Date of Patent: Mar. 2, 1993

[54] IMAGE PICKUP APPARATUS HAVING A GRAY COUNTER

[75] Inventors: Hiroki Hachiyama; Takahiro Iwasawa, both of Kamakura; Masanori Ohmae, Nagaokakyo; Masakatsu Yoshida, Otsu; Toshinobu Hatano, Kamakura; Masakazu Tsuji, Tokyo, all of Japan

[73] Assignee: Matsushita Electric Industrial Co., Ltd., Osaka, Japan

[21] Appl. No.: 695,818

[22] Filed: May 7, 1991

[30] Foreign Application Priority Data

May 9, 1990 [JP] Japan .................. 2-119431

[51] Int. Cl.$^5$ ............................. H04N 5/335
[52] U.S. Cl. ...................... 358/213.15; 358/209; 358/213.11; 377/34
[58] Field of Search .............. 358/209, 213.29, 213.31, 358/167, 213.15, 213.16, 213.17, 213.18; 377/34

[56] References Cited

U.S. PATENT DOCUMENTS

| 4,567,529 | 1/1986 | Yamaguchi et al. | 358/294 |
| 4,599,657 | 7/1986 | Kaji et al. | 358/335 |
| 4,937,845 | 6/1990 | Warner | 377/34 |
| 4,980,778 | 12/1990 | Wittman | 358/446 |
| 5,084,841 | 1/1992 | Williams et al. | 365/189.07 |

FOREIGN PATENT DOCUMENTS

| 0140292 | 5/1985 | European Pat. Off. . |
| 0141486 | 5/1985 | European Pat. Off. . |
| 0355956 | 2/1990 | European Pat. Off. . |
| 59-104857 | 6/1984 | Japan . |
| 59-161922 | 9/1984 | Japan . |
| 62-180612 | 8/1987 | Japan . |
| 62-239621 | 10/1987 | Japan . |
| 1-208024 | 8/1989 | Japan . |
| 3-62698 | 3/1991 | Japan . |
| 1187868 | 4/1970 | United Kingdom . |

OTHER PUBLICATIONS

Fast Synchronous Gray Counter–North Holland Publishing Co.,–D. Porat et al.

Primary Examiner—Herbert Goldstein
Assistant Examiner—Tuan V. Ho
Attorney, Agent, or Firm—Lowe, Price, LeBlanc & Becker

[57] ABSTRACT

An image pickup apparatus includes a lens, and a solid-state image sensor for converting light which passes through the lens into an electric signal. A signal processing circuit serves to process the electric signal outputted from the solid-state image snesor. A Gray code counter serves to count pulses of a first clock signal and to generate Gray codes in response to the first clock signal. A latch device functions to feed a second clock signal and a synchronizing signal to the solid-state image sensor and the signal processing circuit in response to the Gray codes generated by the Gray code counter respectively. The Gray code counter circuit includes n-bit counting stages where n denotes a predetermined natural number, and a plurality of logic decoders for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n.

12 Claims, 7 Drawing Sheets

FIG. 3(A) PRIOR ART
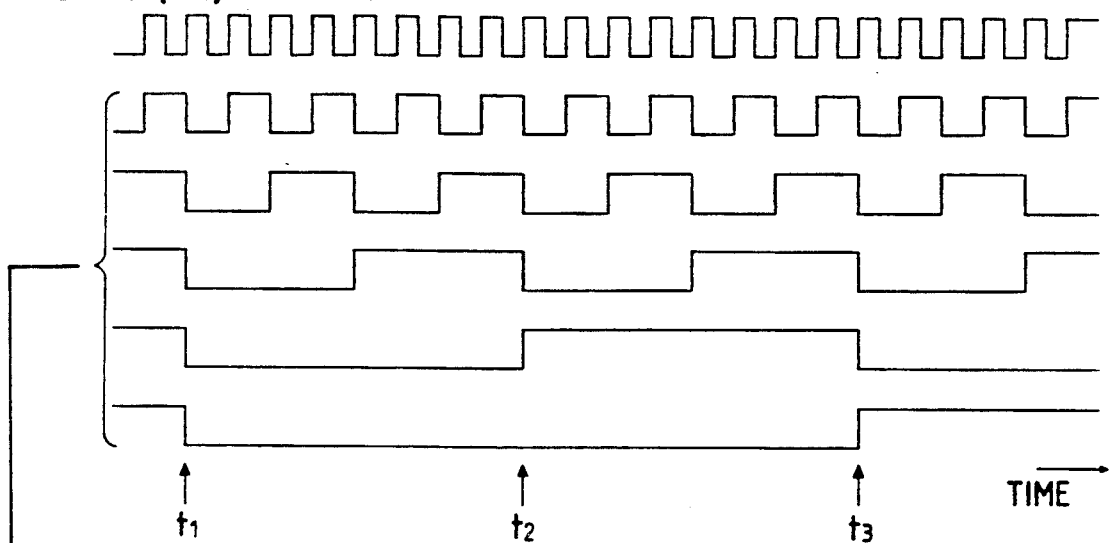
FIG. 3(B) PRIOR ART
FIG. 4
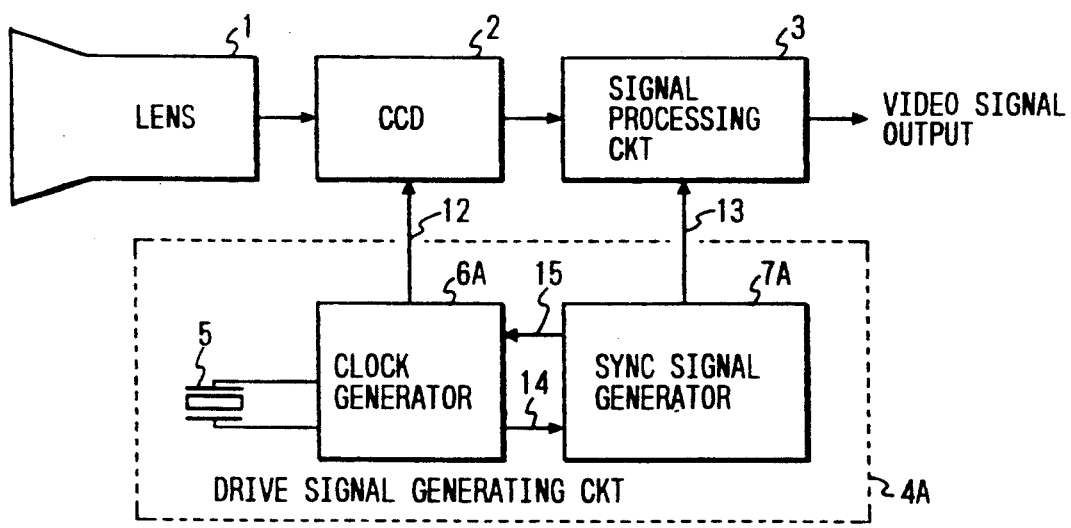

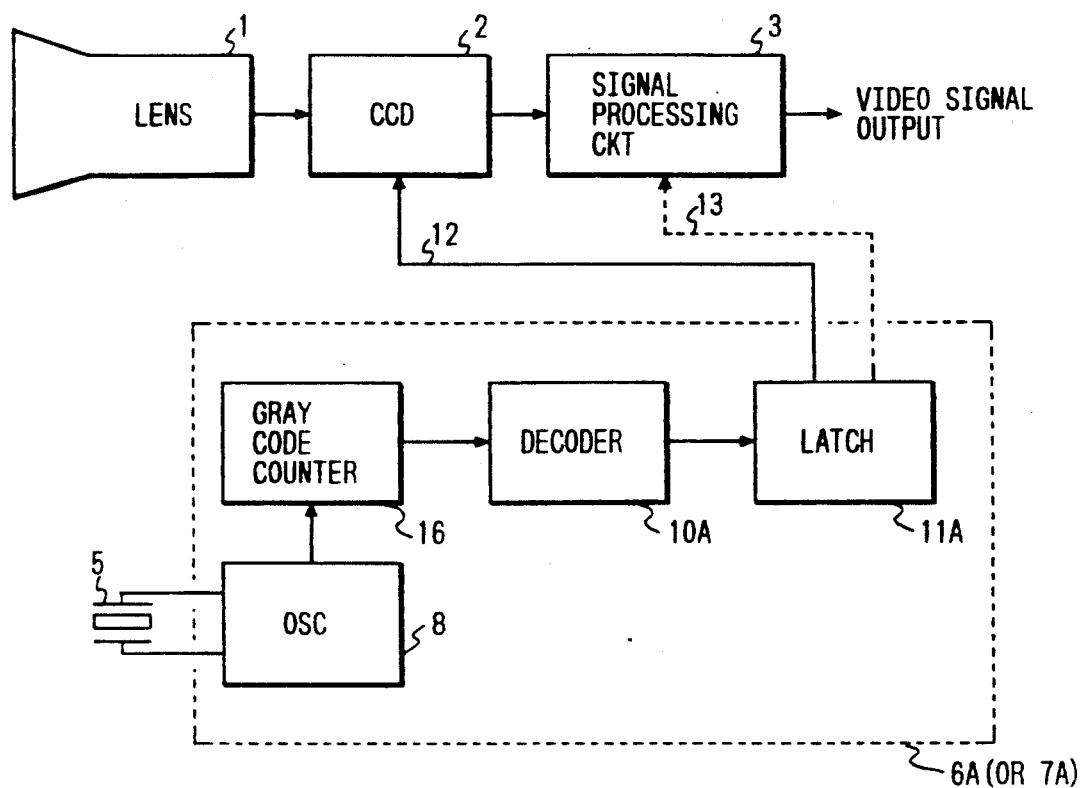
FIG. 5
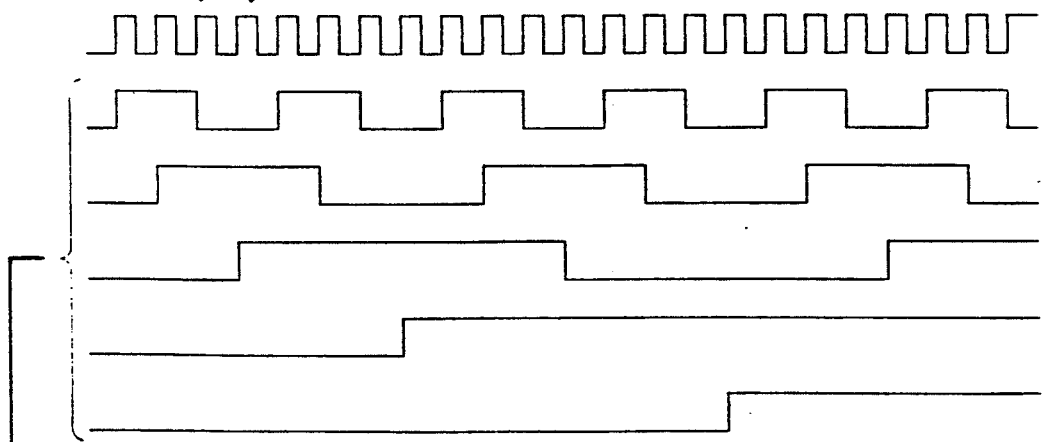
FIG. 6(A)
FIG. 6(B)
TIME

IMAGE PICKUP APPARATUS HAVING A GRAY COUNTER

BACKGROUND OF THE INVENTION

This invention relates to an image pickup apparatus and a counter circuit used therein.

Some of image pickup apparatuses such as video cameras use a solid-state image sensor composed of photodiodes and charge-coupled devices (referred to as CCDs hereafter). A driver for such a solid-state image sensor greatly affects the performance of the image pickup apparatus. As will be explained later, a prior art driver and a background driver have some problems.

SUMMARY OF THE INVENTION

It is an object of this invention to provide an improved image pickup apparatus.

It is another object of this invention to provide an improved counter circuit used in an image pickup apparatus.

A first aspect of this invention provides an image pickup apparatus comprising lens means; a solid-state image sensor for converting light which passes through the lens means into an electric signal; a signal processing circuit for processing the electric signal outputted from the solid-state image sensor; a Gray code counter for counting pulses of a first clock signal and generating Gray codes in response to the first clock signal; and means for feeding a second clock signal and a synchronizing signal to the solid-state image sensor and the signal processing circuit in response to the Gray codes generated by the Gray code counter respectively.

A second aspect of this invention provides an image pickup apparatus comprising lens means; a solid-state image sensor for converting light which passes through the lens means into an electric signal; a signal processing circuit for processing the electric signal outputted from the solid-state image sensor; a counter means for counting pulses of a first clock signal and generating counter output signals in response to the first clock signal, the counter having counting stages outputting signals which change at frequencies outside a frequency band of a video signal; and means for feeding a second clock signal and a synchronizing signal to the solid-state image sensor and the signal processing circuit in response to the counter output signals respectively.

A third aspect of this invention provides a counter circuit comprising n-bit counting stages where n denotes a predetermined natural number; and a plurality of logic decoding means for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage.

A fourth aspect of this invention provides an image pickup apparatus comprising a solid-state image sensor converting light into a corresponding electric signal and outputting the electric signal; a signal processor processing the output electric signal of the solid-stage image sensor into a video signal of a predetermined format; first means for generating a reference clock signal; second means for counting pulses of the reference clock signal, and generating a first Gray-code signal in response to the reference clock signal; third means for decoding the first Gray-code signal into a drive clock signal; fourth means for feeding the drive clock signal to the solid-state image sensor to drive the solid-state image sensor; fifth means for counting the pulses of the reference clock signal, and generating a second Gray-code signal in response to the reference clock signal; sixth means for decoding the second Gray-code signal into a synchronizing signal; and seventh means for feeding the synchronizing signal to the signal processor to control the signal processor.

A fifth aspect of this invention provides an image pickup apparatus comprising a solid-state image sensor converting light into a corresponding electric signal and outputting the electric signal; means for generating a reference clock signal; and means for counting pulses of the reference clock signal, and generating a Gray-code signal in response to the reference clock signal; means for decoding the Gray-code signal into a drive clock signal; and means for feeding the drive clock signal to the solid-state image sensor to drive the solid-state image sensor.

BRIEF DESCRIPTION OF THE DRAWINGS

FIG. 3 is a timing diagram showing the waveforms of signals inputted into and outputted from a binary code counter.

FIG. 4 is a block diagram of an image pickup apparatus according to a first embodiment of this invention.

FIG. 5 is a block diagram of the image pickup apparatus according to the first embodiment of this invention.

FIG. 6 is a timing diagram showing the waveforms of signals inputted into and outputted from the Gray code counter used in the image pickup apparatus of FIGS. 4 and 5.

DESCRIPTION OF THE PRIOR ART AND BACKGROUND ART

Figure 1:
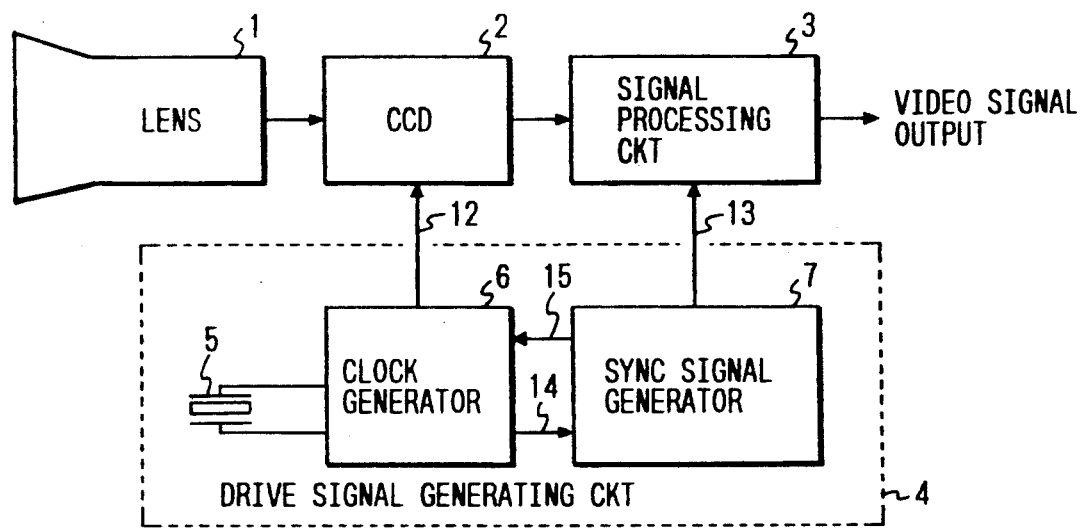
FIG. 1 is a block diagram of a prior art image pickup apparatus.

With reference to FIG 1, a prior art image pickup apparatus includes a lens 1 and CCDs (an array of CCDs) 2. Light passes through the lens 1 and then reaches the CCDs 2, being converted by the CCDs 2 into a corresponding electric signal. The output signal from the CCDs 2 is fed to a signal processing circuit 3, being converted by the signal processing circuit 3 into a corresponding video signal of a predetermined format.

The video signal is fed to a later stage, that is, a video signal circuit (not shown).

The CCDs 2 and the signal processing circuit 3 are driven by a clock signal 12 and a synchronizing signal 13 fed from a drive signal generating circuit 4. The drive signal generating circuit 4 includes a quartz-crystal resonator 5, a clock generator 6, and a synchronizing signal generator 7.

Figure 2:
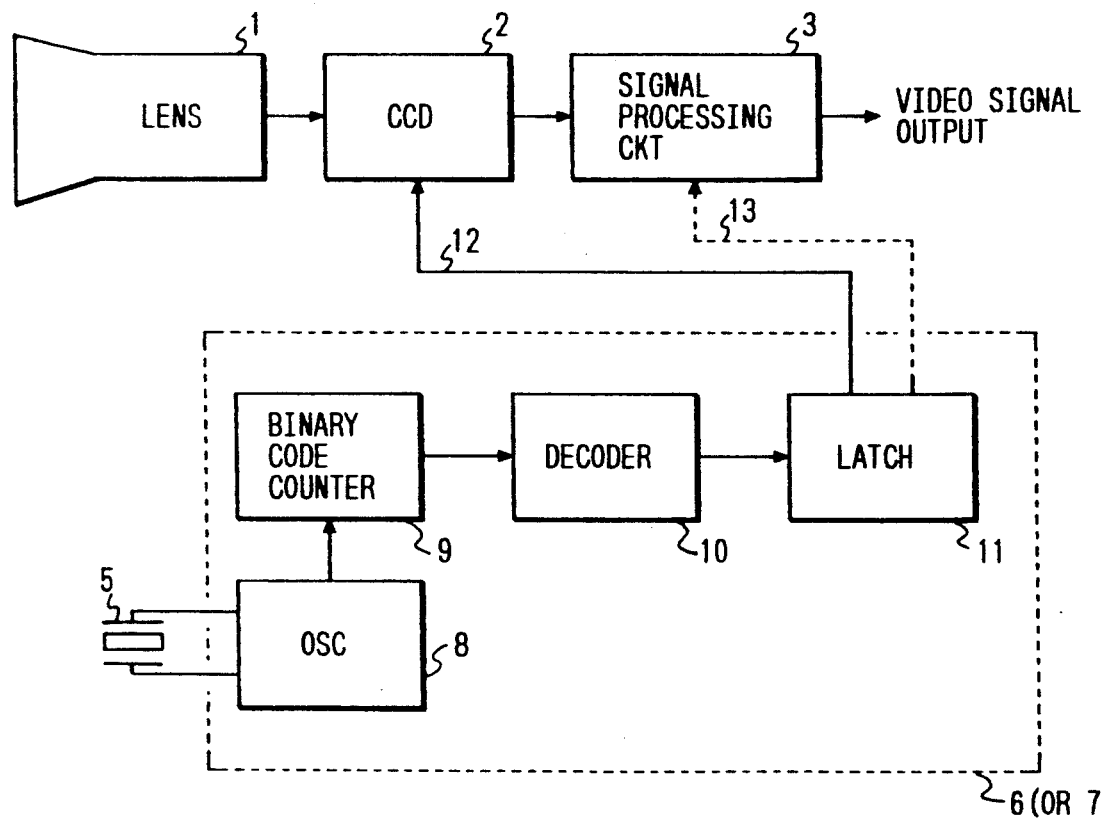
FIG. 2 is a block diagram of the prior art image pickup apparatus.

As shown in FIG. 2, the clock generator 6 includes an oscillation circuit 8, a binary code counter 9, a decoder 10, and a latch circuit 11. The oscillation circuit 8 cooperates with the quartz-crystal resonator 5, generating a reference clock signal. The binary code counter 9 divides the frequency of the output signal from the oscillation circuit 8. The decoder 10 decodes the output signal from the binary code counter 9. The latch circuit 11 latches the output signal from the decoder 10, and feeds the clock signal 12 to the CCDs 2 as a clock signal for charge transfer.

The synchronizing signal generator 7 is basically similar in design to the clock generator 6, and includes a quartz-crystal resonator, an oscillation circuit, a binary code counter, a decoder, and a latch circuit. The latch circuit feeds a signal 13 to the signal processing circuit 3. The signal 13 is used as a synchronizing signal for the signal processing, a synchronizing signal of a television signal, a clamp pulse signal, or a blanking pulse signal.

Since the clock generator 6 and the synchronizing signal generator 7 have similar parts, it is desirable to form the clock generator 6 and the synchronizing signal generator 7 on a single chip.

A description will now be given of a conceivable design (which is not prior art to this invention) in which the clock generator 6 and the synchronizing signal generator 7 are composed of a single chip, and some of the parts of the devices 6 and 7 are used in common. In the conceivable design, the output signal 14 from the oscillator circuit 8 within the clock generator 6 is fed to the binary code counter within the synchronizing signal generator 7. Thus, the binary code counter within the synchronizing signal generator 7 continues the counting operation in response to the output signal from the oscillation circuit 8 within the clock generator 6. A portion of the output signal from the latch circuit within the synchronizing signal generator 7 is fed to the binary code counter 9 within the clock generator 6 as a control signal 15 so that the counting operation of the binary code counter 9 will be suspended during a scanning period, and that the counting operation of the binary code counter 9 will be executed during a blanking period. As a result, the output signal from the latch circuit within the clock generator 6 is fed to the CCDs 2 as a clock signal 12 for charge transfer. In addition, the output signal from the latch circuit within the synchronizing signal generator 7 is fed to the signal processing circuit 3 as a synchronizing signal 13 for signal processing.

The inventors performed experiments on the conceivable design and found the following facts. In the case where the clock generator 6 and the synchronizing signal generator 7 were formed on a common semiconductor substrate and were composed of a single chip, and where the counter for counting reference clock pulses to generate 1-H periods (one horizontal scanning periods) was composed of a binary code counter in the synchronizing signal generator 7, jitter components were given to a high-speed drive pulse signal (for example, a horizontal transfer pulse signal) at a timing where many bits of the counter simultaneously changed in digit value. As a result, a final image reproduced on the screen of a display was contaminated by vertical stripe noise of a fixed pattern.

This problem in the conceivable design will be further described. In the case where a binary code counter is fed with a clock signal having a waveform of the part (A) of FIG. 3, the binary code counter divides the frequency of the clock signal by factors of $\frac{1}{2}$, $\frac{1}{4}$, $\frac{1}{8}$, ... so that the binary code counter outputs a signal of bits having waveforms of the part (B) of FIG. 3. In FIG. 3, at timings t1 and t3, five output bits of the counter change simultaneously. In addition, at a timing t2, four output bits of the counter change simultaneously.

In the conceivable design including a single chip forming both the clock generator 6 and the synchronizing signal generator 7, at such timings t1, t2, and t3 where many output bits of the binary code counter change simultaneously, a trigger-like power supply current greater than a normal power supply current flows through the circuit in the chip. The trigger-like current causes fixed-pattern noise components in the output video-information signals from the CCDs 2 and the signal processing circuit 3. The noise components result in vertical stripes in a finally-reproduced image. Further, the trigger-like current causes undesired radiation which interferes with the operation of peripheral circuits.

It was found that a similar problem arose when the counter within the clock generator 6 was composed of a binary code counter.

DESCRIPTION OF THE FIRST PREFERRED EMBODIMENT

With reference to FIGS. 4 and 5, an image pickup apparatus includes a lens 1 and CCDs (an array of CCDs) 2. Light passes through the lens 1 and then reaches the CCDs 2, being converted by the CCDs 2 into a corresponding electric signal. The output signal from the CCDs 2 is fed to a signal processing circuit 3, being converted by the signal processing circuit 3 into a corresponding video signal of a predetermined format. The video signal is fed to a later stage, that is, a video signal circuit (not shown).

The CCDs 2 and the signal processing circuit 3 are driven by a clock signal 12 and a synchronizing signal 13 fed from a drive signal generating circuit 4A. The drive signal generating circuit 4A includes a quartz-crystal resonator 5, a clock generator 6A, and a synchronizing signal generator 7A. The clock generator 6A and the synchronizing signal generator 7A are composed of a single common chip.

As shown in FIG. 5, the clock generator 6A includes an oscillation circuit 8, a Gray code counter 16, a decoder 10A, and a latch circuit 11A. The oscillation circuit 8 cooperates with the quartz-crystal resonator 5, generating a reference clock signal. The Gray code counter 16 divides the frequency of the output signal from the oscillation circuit 8. The decoder 10A decodes the output signal from the Gray code counter 16. The latch circuit 11A latches the output signal from the decoder 10A, and feeds the clock signal 12 to the CCDs 2 as a clock signal for charge transfer.

The synchronizing signal generator 7A is basically similar in design to the clock generator 6A, and includes a quartz-crystal resonator, an oscillation circuit, a Gray code counter, a decoder, and a latch circuit. The latch circuit feeds a signal 13 to the signal processing circuit 3. The signal 13 is used as a synchronizing signal for the signal processing, a synchronizing signal of a television signal, a clamp pulse signal, or a blanking pulse signal.

In the clock generator 6A, the reference clock signal 5 fed from the oscillator circuit 8 to the Gray code counter 16 has a waveform as shown in the part (A) of FIG. 6. The Gray code counter 16 divides the frequency of the reference clock signal by factors of $\frac{1}{2}$, $\frac{1}{4}$, $\frac{1}{8}$, ... so that the Gray code counter 16 outputs a signal of bits having waveforms of the part (B) of FIG. 6. As shown in FIG. 6, at each transition in the reference clock signal, only one of the bits of the output signal from the Gray code counter 16 undergoes a change. Therefore, it is possible to limit the variation of the power supply current within an acceptable range where a trigger-like power supply current is prevented from flowing through the related circuit. Thus, vertical stripe noise is prevented from occurring in a finally-reproduced image, and undesired radiation is also prevented from occurring.

Figure 7:
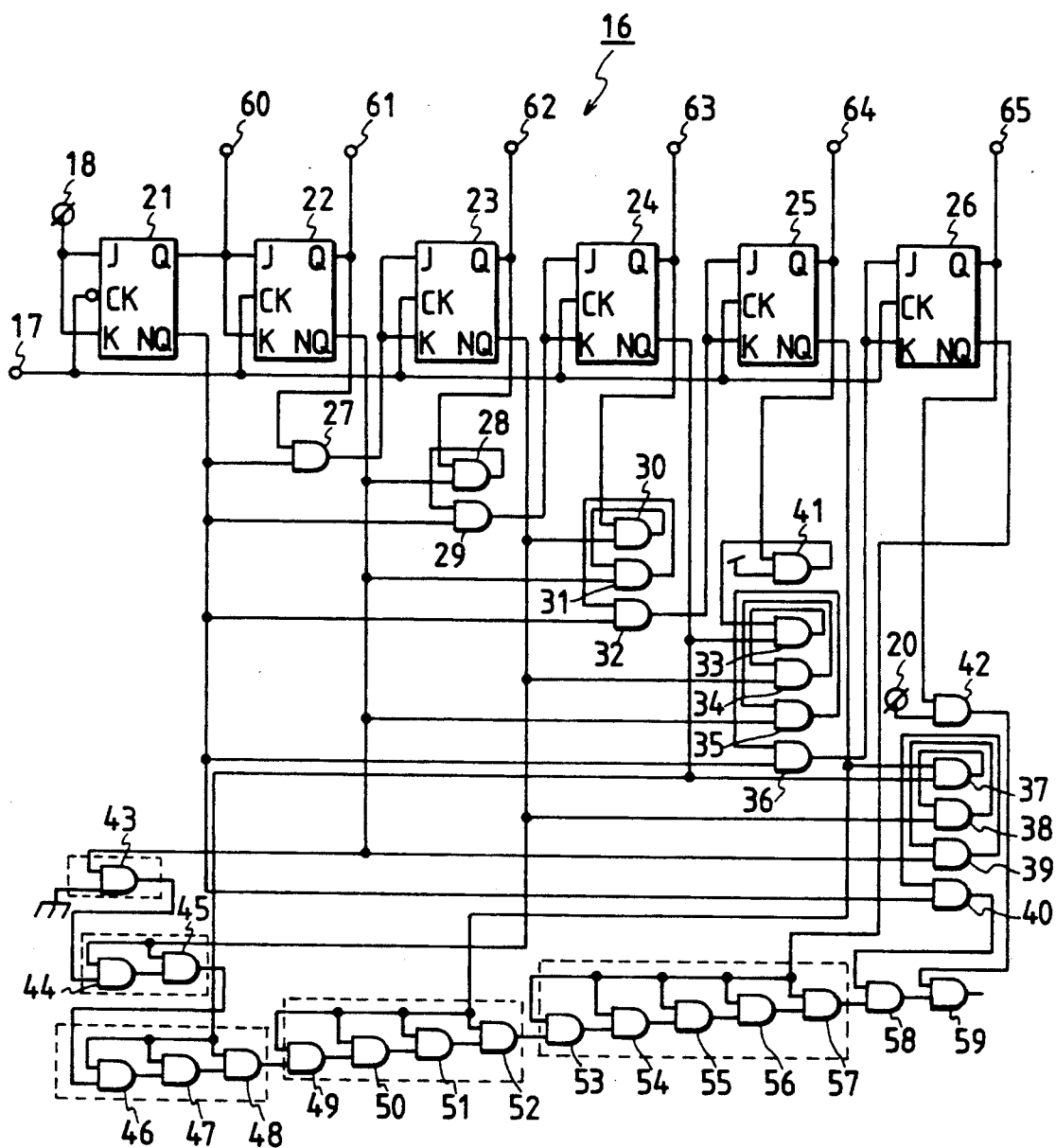
FIG. 7 is a block diagram of the Gray code counter of FIG. 5.

As shown in FIG. 7, the Gray code counter 16 includes a clock input terminal 17 and a set of J-K flip-flops 21-26 corresponding to first to sixth counting stages (bits) respectively. The reference clock signal outputted from the oscillation circuit 8 (see FIG. 5) is fed to the clock terminals CK of the J-K flip-flops 21-26 via the clock input terminal 17.

The J terminal and the K terminal of each of the J-K flip-flops 21-26 are connected in common. The first-stage J-K flip-flop 21 are connected to a power supply terminal 18. The Q output terminal of the first-stage J-K flip-flop 21 is connected to the J terminal and the K terminal of the subsequent-stage J-K flip-flop 22. The NQ output terminal of the first-stage J-K flip-flop 21 is connected to a first input terminal of a logic gate 27 for logic decoding. A second input terminal of the logic gate 27 is connected to the Q output terminal of the second-stage J-K flip-flop 22. The output terminal of the logic gate 27 is connected to the J terminal and the K terminal of the third-state J-k flip-flop 23.

Similarly, logic gates 28-36 for logic decoding are connected among the third-stage, fourth-state, fifth-stage, and sixth-stage J-K flip-flops 23, 24, 25, and 26. The decoding logic gates 27-36 are composed of two-input AND gates.

Logic gates 37-42 are connected to the specific Q output terminals and the NQ output terminals of the J-K flip-flops 21-26. The logic gates 37-42 serve to equalize the number of bit or bits simultaneously subjected to changes. In addition, logic gates 43-59 for adjusting load capacitances are connected to the set of the J-K flip-flops 21-26, the set of the logic gates 27-36, and the set of the logic gates 37-42. The logic gates 37-59 are composed of two-input AND gates.

A terminal 20 leading the logic gate 42 is subjected to a positive power supply voltage or a high-level fixed voltage. Respective counting stages of the Gray code counter 16 include output terminals 60-65 corresponding to bits respectively. The output terminals 60-65 are connected to the Q output terminals of the J-K flip-flops 21-26 respectively.

Figure 8:
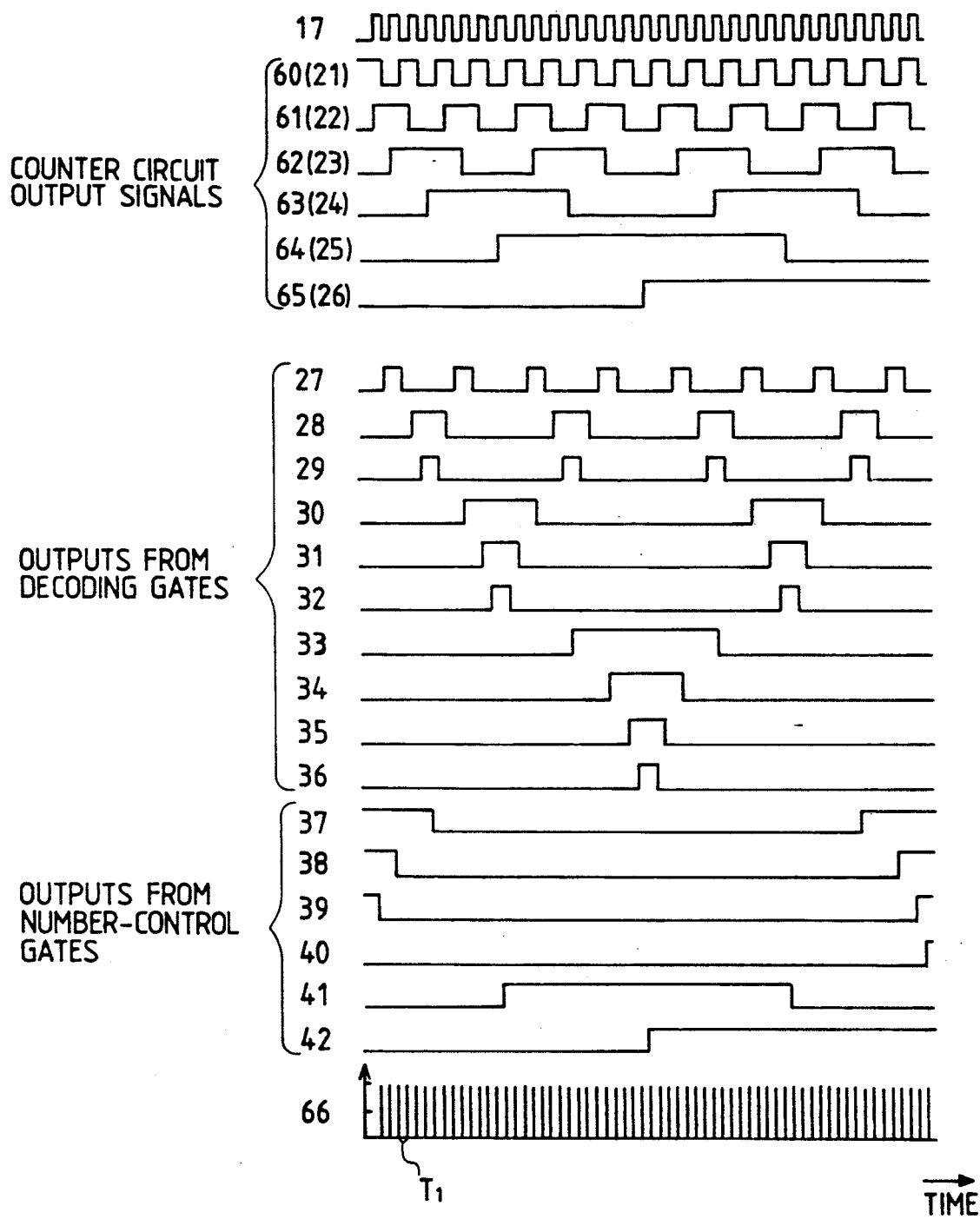
FIG. 8 is a timing diagram showing the waveforms of various signals in the Gray code counter of FIG. 7.

FIG. 8 shows the waveforms of various signals in the Gray code counter 16 of FIG. 7. In FIG. 8, the numerals denote the waveforms of the signals inputted into and outputted from the devices represented by the same numerals of FIG. 7. Specifically, in FIG. 8, the numeral 17 denotes the waveform of the reference clock signal inputted via the input terminal 17 of FIG. 7, and the numerals 60-65 denote the waveforms of the output signals which appear at the output terminals 60-65 of FIG. 7 respectively. In addition, the numerals 27-36 denote the waveforms of the output signals from the decoding logic gates 27-36 respectively, and the numerals 37-42 denote the waveforms of the output signals from the change-bit-number controlling logic gates 37-42 respectively. In FIG. 8, the numeral 66 denotes the number of the output signals from the gates which simultaneously undergo changes.

A description will now be given of the operation of the Gray code counter 16 of FIG. 7 with reference to FIG. 8. In the case where the reference clock signal is inputted via the input terminal 17, the Q output signal from the first-stage J-K flip-flop 21 is inverted at the moment of the occurrence of each falling edge in the reference clock signal, so that the Q output signal from the first-stage J-K flip-flop 21 has a waveform 60 (21) of FIG. 8.

The Q output signal from the first-stage J-K flip-flop 21 is fed to the J terminal and the K terminal of the second-stage J-K flip-flop 22. Thus, the Q output signal from the second-stage J-K flip-flop 22 is inverted at the moment of the occurrence of each rising edge in the reference clock signal, provided that the Q output signal from the first-stage J-K flip-flop 21 is in its high-level state. As a result, the Q output signal from the second-stage J-K flip-flop 22 has a waveform 61 (22) of FIG. 8.

The NQ output signal from the first-stage J-K flip-flop 21 and the Q output signal from the second-stage J-K flip-flop 22 are inputted into the logic gate 27, and are decoded by the logic gate 27 into a pulse signal which is fed to the J terminal and the K terminal of the third-stage J-K flip-flop 23. Provided that the Q output signal from the second-stage J-K flip-flop 22 is in its high-level state and the NQ output signal from the first-stage J-K flip-flop 22 is in its high-level state, the Q output signal from the third-stage J-K flip-flop 23 is inverted at the moment of the occurrence of each rising edge in the reference clock signal. As a result, the Q output signal from the third-stage J-K flip-flop 23 has a waveform 62 (23) of FIG. 8.

The later stages perform similar processes. Specifically, the logic gates 28 and 29 receive the Q output signal from the third-stage J-K flip-flop 23 and the NQ output signals from the first-stage and second-stage J-K flip-flops 21 and 22, decoding the received signals into a pulse signal which is fed to the fourth-stage J-K flip-flop 24. The logic gates 30, 31, and 32 receive the Q output signal from the fourth-stage J-K flip-flop 24 and the NQ output signals from the first-stage, second-stage, and third-stage J-K flip-flops 21, 22, and 23, decoding the received signals into a pulse signal which is fed to the fifth-stage J-K flip-flop 25. The logic gates 33, 34, 35, and 36 receive the Q output signal from the fifth-stage J-K flip-flop 25 and the NQ output signals from the first-stage, second-stage, third-stage, and fourth-stage J-K flip-flops 21, 22, 23, and 24, decoding the received signals into a pulse signal which is fed to the sixth-stage J-K flip-flop 26. As a result, the Q output signals from the fourth-stage and later stage J-K flip-flops 24-26, that is, the output signals induced at the output terminals 63-65, have waveforms 63-65 (24-26) of FIG. 8. In addition, the output signals from the logic gates 27-36 have waveforms 27-36 of FIG. 8.

As shown in FIG. 8, the output bit signals 60-65 from the Gray code counter 16 compose a Gray code output signal in which only one of the bits undergoes a logic state change at each transition timing. In FIG. 8, the numeral 66 denotes the number of the signals among the signals 60-65, 27-36, and 37-42 which simultaneously undergo logic-state changes. Specifically, at a first transition timing, the signal 61 changes from the low level to the high level while the signal 39 changes from the high level to the low level. Thus, at the first transition timing, the number of the signals which simultaneously undergo logic-state changes is equal to 2. At a second transition timing, the signals 60 and 27 change simultaneously in logic state, and the number of the simultaneously-changing signals is also equal to 2. At a third transition timing, the signals 62 and 38 change simultaneously in logic state, and the number of the simultaneously-changing signals is also equal to 2. Similarly, at later transition timings, the number of the simultaneously-changing signals is maintained at 2. Thus, in the Gray code counter of FIG. 7, the number of the simultaneously-changing signals is limited to 2. This is advantageous in preventing vertical stripe noise from occurring in a finally-reproduced image, and preventing undesired radiation.

Figure 9:
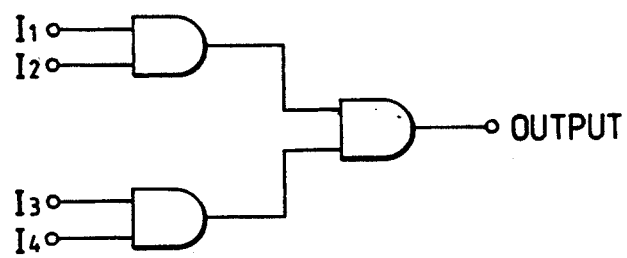
FIG. 9 is a block diagram of a prior art multi-input AND circuit.

The decoding logic gates 28-36 and the change-bit-number controlling logic gates 37-40 are designed so as to equalize the number of simultaneously-changing signals. Specifically, the logic gates 28 and 29 compose a 4-input AND gate which is quite different from a well-known typical 4-input AND gate shown in FIG. 9. In the well-known 4-input AND gate of FIG. 9, a lower bit I4 changes at a low frequency while a higher bit I1 changes at a higher frequency, so that there periodically occurs a timing at which both the lower bit I4 and the higher bit I1 change simultaneously. Therefore, by using the well-known 4-input AND gate of FIG. 4, it is generally difficult to equalize the number of simultaneously-changing signals. On the other hand, in the embodiment of this invention, the output signal from the first logic gate 28 is inputted into the second logic gate 29 so as to virtually compose a 4-input AND gate. This arrangement ensures that the number of simultaneously-changing signals will always be equalized. The set of the logic gates 30-32, the set of the logic gates 33-36, and the set of the logic gates 37-40 are designed similarly.

In the Gray code counter 16 of FIG. 7, the NQ output terminals of the J-K flip-flops 21-26 are connected to different numbers of the logic gates selected from the decoding logic gates 27-36 and the change-bit-number controlling logic gates 37-40. Specifically, the NQ output terminal of the first-stage J-K flip-flop 21 is connected to the five logic gates 27, 29, 32, 36, and 40 while the NQ output terminal of the second-stage J-K flip-flop 22 is connected to the four logic gates 28, 31, 35, and 39. Further, the NQ output terminal of the third-stage J-K flip-flop 23 is connected to the three logic gates 30, 34, and 38 while the NQ output terminal of the fourth-stage J-K flip-flop 24 is connected to the two logic gates 33 and 37. In addition, the NQ output terminal of the fifth-stage J-K flip-flop 25 is connected to the one logic gate 37 while the NQ output terminal of the final-stage J-K flip-flop 26 is not connected to any logic gate.

When the J-K flip-flops 21-26 are connected to different numbers of the logic gates in this manner, the load capacitances of the output lines of the respective counting stages of the Gray code counter 16 would be uneven. Such an unevenness might cause counting noise of uneven levels in response to the reference clock signal. In the Gray code counter 16 of FIG. 7, the capacitance-adjusting logic gates 43-59 are added in order to remove such an unevenness in the load capacitances of the output lines of the respective counting stages. Specifically, the logic gate 43 is provided for the second-stage J-K flip-flop 22, and the logic gates 44 and 45 are provided for the third-stage J-K flip-flop 23. The logic gates 46-48 are provided for the fourth-stage J-K flip-flop 24. The logic gates 49-52 are provided for the fifth-stage J-K flip-flop 25. The logic gates 53-57 are provided for the sixth-stage J-K flip-flop 26. According to this arrangement, the J-K flip-flops 21-26 are connected to equal numbers of logic gates so that the load capacitances of the output lines of the respective counting stages can be even. Specifically, the first-stage J-K flip-flop 21 is connected to the five logic gates 27, 29, 32, 36, and 40, and the second-stage J-K flip-flop 22 is also connected to the five logic gates 28, 31, 35, 39, and 43. The third-stage J-K flip-flop 23 is also connected to the five logic gates 30, 34, 38, 44, and 45. The fourth-stage J-K flip-flop 24 is also connected to the five logic gates 33, 37, 46, 47, and 48. The fifth-stage J-K flip-flop 25 is also connected to the five logic gates 37, 49, 50, 51, and 52. The sixth-stage J-K flip-flop 26 is also connected to the five logic gates 53-57.

The capacitance-adjusting logic gates 58 and 59 are used in processing the output signals from the change-bit-number controlling logic gates 37-42.

This embodiment may be modified in various ways. For example, the design of FIG. 7 may be modified to compose an n-bit Gray code counter where "n" denotes a natural number different from 6. In this modification, the J terminal and the K terminal of a k-th-bit J-K flip-flop are fed with an output pulse signal from a set of logic gates which cooperate to decode the Q output signal from a (k−1)-th-bit J-K flip-flop and the NQ output signals from a 1-st-bit to a (k−2)-th-bit J-K flip-flops.

In a second modification, the AND gates 27-59 are replaced by D flip-flops and Exclusive-OR gates. In a third modification, the decoding AND gates 27-36 are replaced by multi-input AND gates or other logic gates such as NAND gates. In the case where the decoding AND gates 27-36 are replaced by the NAND gates, a phase inverting process is performed at an input side or an output side. In a fourth modification, the change-bit-number controlling AND gates 37-42 and the capacitance-adjusting AND gates 43-59 are replaced by multi-input AND gates or other logic circuits.

DESCRIPTION OF THE SECOND PREFERRED EMBODIMENT

Figure 10:
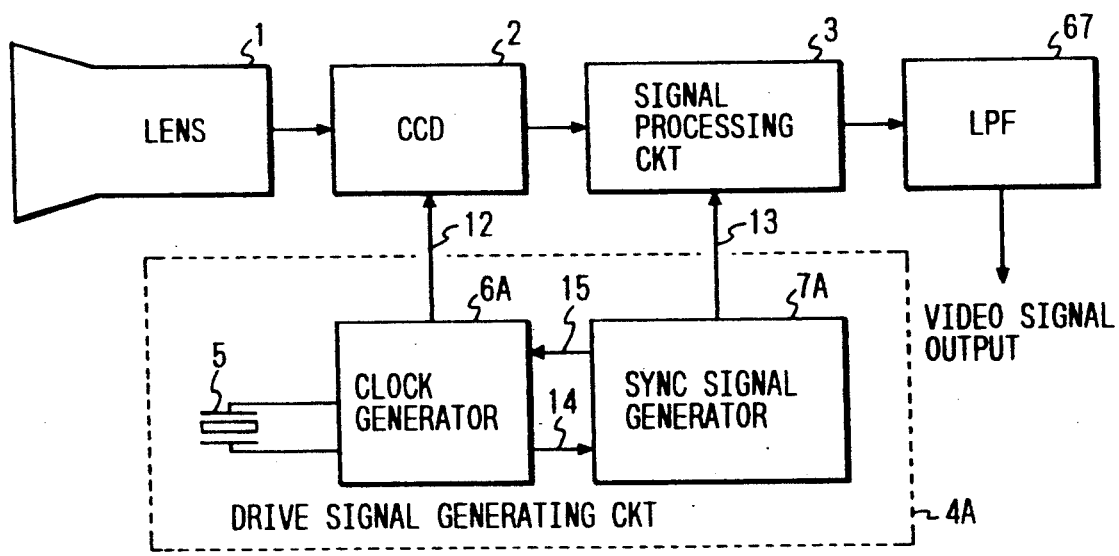
FIG. 10 is a block diagram of an image pickup apparatus according to a second embodiment of this invention.

FIG. 10 shows a second embodiment of this invention which is similar to the embodiment of FIGS. 4-8 except for design changes indicated hereinafter. In the embodiment of FIG. 10, Gray code counters within a clock generator 6A and a synchronizing signal generator 7A are designed so that the frequency of the occurrence of simultaneous changes of signals in the Gray code counters will be higher than a frequency band of a video signal. Further, the embodiment of FIG. 10 additionally includes a low pass filter 67 which processes the output video signal from a signal processing circuit 3. The low pass filter 67 removes high-frequency noise components from the video signal and passes only true signal components of the video signal. The output signal from the low pass filter 67 is used as an output signal from an image pickup apparatus.

As shown in FIG. 8, the output signals of respective counting stages of the Gray code counter change in logic state in synchronism with a reference clock signal 17. In addition, the output signals from logic gates 27-42 change in logic state in synchronism with the reference clock signal 17. In other words, the timing of the occurrence of simultaneous changes of signals (see the part 66 of FIG. 8) is synchronous with the reference clock signal 17. By setting the frequency of the reference clock signal 17 higher than the frequency band of the video signal, the frequency of the occurrence of simultaneous changes of signals in the Gray code counters is made higher than the frequency band of the video signal.

Figure 11:
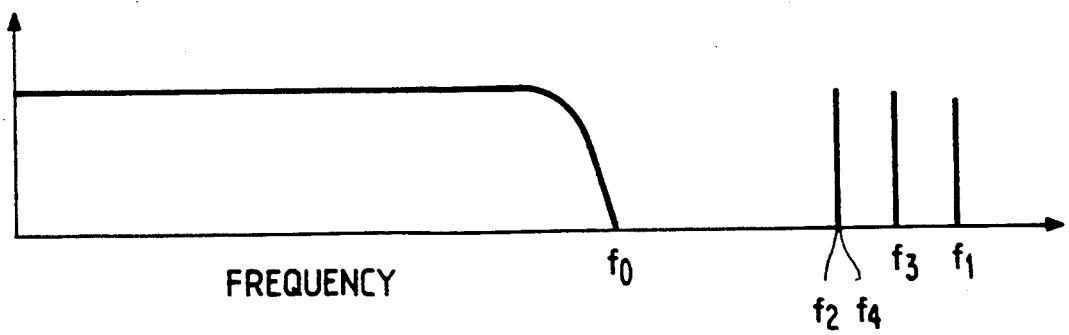
FIG. 11 is a frequency-domain diagram showing signals in the image pickup apparatus of FIG. 10.

The period of the occurrence of simultaneous changes of signals in the Gray code counters is now represented by the character T1 as shown in FIG. 8. The frequency of the occurrence of simultaneous changes of signals in the Gray code counters is represented by the character f1. The period and the frequency have the relation as "f1=1/T1". As shown in FIG. 11, the frequency f1 is set higher than the upper limit f0 of the frequency band of the video signal. It is well-known that the frequency band of a video signal depends on the format of the video signal. For example, the frequency band of an NTSC television signal is equal to 4.2 MHz, and the frequency bands of a PAL television signal and a SECAM television signal range from 5 MHz to 6 MHz.

In this embodiment, even if simultaneous changes of signals in the Gray code counters cause noise, the frequency of the noise is higer than the frequency band of the video signal and therefore the noise is effectively removed from the video signal by the low pass filter 67.

Figure 12:
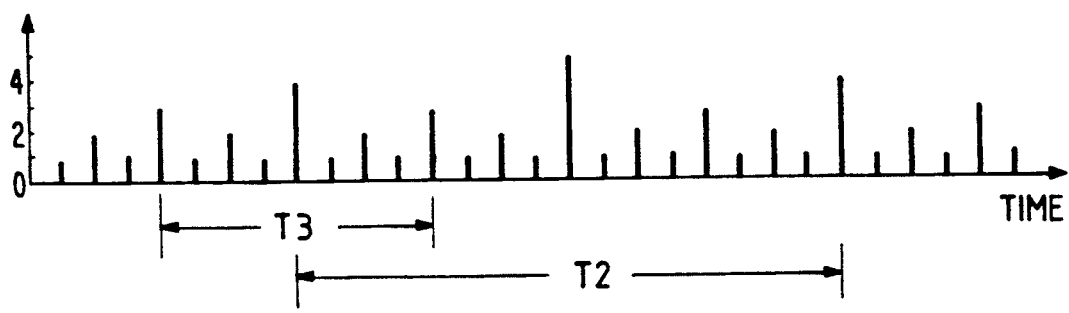
FIGS. 12 and 13 are time-domain diagrams which show timings at which signals change in logic state in modifications of the second embodiment of this invention.
Figure 13:
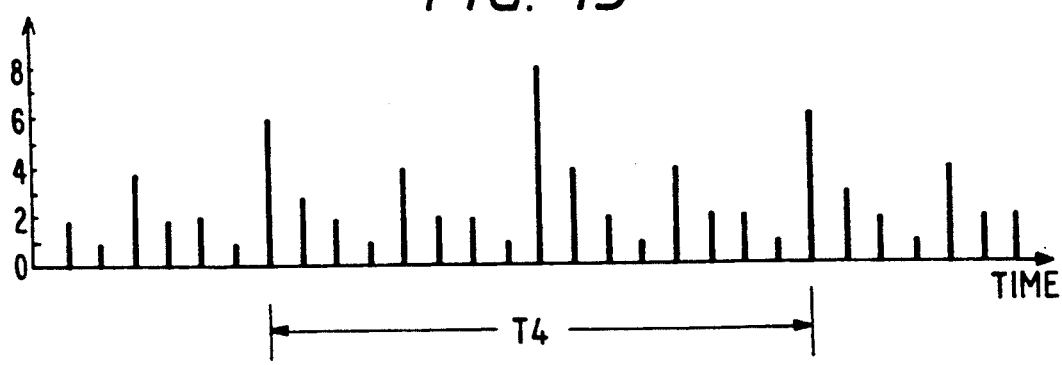

This embodiment may be modified as follows. In a modification of this embodiment, the Gray code counters are replaced by Johnson counters, ring counters, or other counters. In this modification, when simultaneous changes of signals in the counters have periods T2 and T3 as shown in FIG. 12, the related frequencies f2 (=1/T2) and f3 (=1/T3) are set higher than the frequency band of the video signal by suitably choosing the frequency of the reference clock signal. In addition, when simultaneous changes of signals in the counters have a period T4 as shown in FIG. 13, the related frequency f4 (=1/T4) is set higher than the frequency band of the video signal by suitably choosing the frequency of the reference clock signal.

What is claimed is:

1. An image pickup apparatus comprising:
lens means;
a solid-state image sensor for converting light which passes through the lens means into an electric signal;
a signal processing circuit for processing the electric signal outputted from the solid-state image sensor;
a Gray code counter for counting pulses of a first clock signal and generating Gray codes in response to the first clock signal; and
means for feeding a second clock signal and a synchronizing signal to the solid-state image sensor and the signal processing circuit in response to the Gray codes generated by the Gray code counter respectively,
wherein the Gray code counter comprises n-bit counting stages where n denotes a predetermined natural number, and a plurality of logic decoding means for feeding logic outputs to input terminals of the respective counting stages, the logic outputs being equivalent to a produce of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage.

2. An image pickup apparatus comprising:
lens means;
a solid-state image sensor for converting light which passes through the lens means into an electric signal;
a signal processing circuit for processing the electric signal outputted from the solid-state image sensor;
a Gray code counter for counting pulses of a first clock signal and generating Gray codes in response to the first clock signal; and
means for feeding a second clock signal and a synchronizing signal to the solid-state image sensor and the signal processing circuit in response to the Gray codes generated by the Gray code counter respectively,
wherein the Gray code counter comprises n-bit counting stages where n denotes a predetermined natural number, and a plurality of logic decoding means for feeding logic outputs to input terminals of the respective counting stages, the logic outputs being equivalent to a produce of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage, and
the decoding means comprises an x number of multi-input logic circuits where x denotes a predetermined natural number, means for inputting an output signal of a j-th of the multi-input logic circuits into a (j+1)-th of the multi-input logic circuits where j denotes a natural number between 1 and (x−1), and means for feeding an output signal from the x-th of the multi-input logic circuits to the input terminal of the counting stages.

3. An image pickup apparatus comprising:
lens means;
a solid-state image sensor for converting light which passes through the lens means into an electric signal;
a signal processing circuit for processing the electric signal outputted from the solid-state image sensor;
a Gray code counter for counting pulses of a first clock signal and generating Gray codes in response to the first clock signal; and
means for feeding a second clock signal and a synchronizing signal to the solid-state image sensor and the signal processing circuit in response to the Gray codes generated by the Gray code counter respectively, wherein the Gray code counter comprises n-bit counting stages where n denotes a predetermined natural number, a plurality of logic decoding means for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage, load-capacitance adjusting logic circuits, and means for connecting the load-capacitance adjusting logic circuits to output terminals of the respective counting stages to equalize numbers of logic circuits of the logic decoding means and the load-capacitance adjusting logic circuits which are connected to the output terminals of the counting stages respectively.

4. An image pickup apparatus comprising:
lens means;
a solid-state image sensor for converting light which passes through the lens means into an electric signal;
a signal processing circuit for processing the electric signal outputted from the solid-state image sensor;
a Gray code counter for counting pulses of a first clock signal and generating Gray codes in response to the first clock signal; and
means for feeding a second clock signal and a synchronizing signal to the solid-state image sensor and the signal processing circuit in response to the Gray codes generated by the Gray code counter respectively,
wherein the Gray code counter comprises n-bit counting stages where n denotes a predetermined natural number, a plurality of logic decoding means for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage, and additional logic circuits for equalizing numbers of simultaneous transition on the logic decoding means and the additional logic circuits at each transition of a clock signal inputted to the counting means.

5. An image pickup apparatus comprising:
lens means;
a solid-state image sensor for converting light which passes through the lends means into an electric signal;
a signal processing circuit for processing the electric signal outputted from the solid-state image sensor;
a counter means for counting pulses of a first clock signal and generating counter output signals in response to the first cock signal, the counter having counting stages outputting signals which change at frequencies outside a frequency band of a video signal; and
means for feeding a second clock signal and a synchronizing signal to the solid-state image sensor and the signal processing circuit in response to the counter output signals respectively,
wherein the counter means includes a Gray code counter, comprising n-bit counting stages where n denotes a predetermined natural number, and a plurality of logic decoding means for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage.

6. A counter circuit comprising:
n-bit counting stages where n denotes a predetermined natural number; and
a plurality of logic decoding means for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage.

7. The counter circuit of claim 6 wherein the decoding means comprises an x number of multi-input logic circuits where x denotes a predetermined natural number, means for inputting an output signal of a j-th of the multi-input logic circuits into a (j+1)-th of the multi-input logic circuits where j denotes a natural number between 1 and (x−1), and means for feeding an output signal from the x-th of the multi-input logic circuits to the input terminal of the counting stages.

8. The counter circuit of claim 6 further comprising loadcapacitance adjusting logic circuits, and means for connecting the load-capacitance adjusting logic circuits to output terminals of the respective counting stages to equalize numbers of logic circuits of the logic decoding means and the load-capacitance adjusting logic circuits which are connected to the output terminals of the counting stages respectively.

9. The counter circuit of claim 6 further comprising additional logic circuits for equalizing numbers of simultaneous transition on the logic decoding means and the additional logic circuits at each transition of a clock signal inputted to the counting means.

10. An image pickup apparatus comprising:
a solid-state image sensor converting light into a corresponding electric signal and outputting the electric signal;
a signal processor processing the output electric signal of the solid-stage image sensor into a video signal of a predetermined format;
first means for generating a reference clock signal;

second means for counting pulses of the reference clock signal, and generating a first Gray-code signal in response to the reference clock signal;

third means for decoding the first Gray-code signal into a drive clock signal;

fourth means for feeding the drive clock signal to the solid-state image sensor to drive the solid-state image sensor;

fifth means for counting the pulses of the reference clock signal, and generating a second Gray-code signal in response to the reference clock signal;

sixth means for decoding the second Gray-code signal into a synchronizing signal; and seventh means for feeding the synchronizing signal to the signal processor to control the signal processor;

wherein said second means for counting pulses comprises n-bit counting stages where n denotes a predetermined natural number, and a pluralitty of logic decoding means for feeding logic outputs to input terminals of the respective counting stages, the logic outputs being equivalent to a product of a first logic output of a (k−1)-th-bit counting stage and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage.

11. The image pickup apparatus of claim 10 further comprising a single semiconductor circuit chip including both the first means, the second means, the third means, the fifth means, and the sixth means.

12. An image pickup apparatus comprising:

a solid-state image sensor converting light into a corresponding electric signal and outputting the electric signal;

means for generating a reference clock signal; and means for counting pulses of the reference clock signal, and generating a Gray-code signal in response to the reference clock signal;

means for decoding the Gray-code signal into a drive clock signal; and means for feeding the drive clock signal to the solid-state image sensor to drive the solid-state image sensor, wherein said means for counting pulses comprises n-bit counting stages where n denotes a predetermined natural number, and a plurality of logic decoding means for feeding logic outputs to input terminals of the respective counting stages, the logic outputs being equivalent to a product of a first logic output of a (k−1)-th-bit counting stagre and second logic outputs of a (k−2)-th-bit counting stage and lower-bit counting stages where k denotes a natural number between 3 and n, and for feeding a logic output, being equivalent to a product of a first logic output of the (k−1)-th-bit counting stage and second logic outputs of the (k−2)-th-bit and lower bit counting stages, to an input terminal of a k-th-bit counting stage.

* * * * *